(12) United States Patent
Wang et al.

(10) Patent No.: US 11,650,249 B1
(45) Date of Patent: May 16, 2023

(54) WAFER TESTING AND STRUCTURES FOR WAFER TESTING

(71) Applicant: XILINX, INC., San Jose, CA (US)

(72) Inventors: Yan Wang, San Jose, CA (US); Nui Chong, San Jose, CA (US)

(73) Assignee: XILINX, INC., San Jose, CA (US)

( * ) Notice: Subject to any disclaimer, the term of this patent is extended or adjusted under 35 U.S.C. 154(b) by 297 days.

(21) Appl. No.: 16/941,422

(22) Filed: Jul. 28, 2020

(51) Int. Cl.
*G01R 31/3185* (2006.01)
*G01R 31/28* (2006.01)
*G01R 3/00* (2006.01)

(52) U.S. Cl.
CPC .. *G01R 31/318511* (2013.01); *G01R 31/2884* (2013.01)

(58) Field of Classification Search
CPC ...... H01L 22/34; H01L 2924/14; H01L 22/00
See application file for complete search history.

(56) References Cited

U.S. PATENT DOCUMENTS

| | | | |
|---|---|---|---|
| 6,503,765 B1 | 1/2003 | Chao et al. | |
| 8,485,418 B2 * | 7/2013 | Eldridge | B23K 20/004 228/180.5 |
| 10,180,454 B2 | 1/2019 | Parekhji et al. | |
| 2012/0104387 A1 * | 5/2012 | Chen | H01L 22/34 257/532 |
| 2015/0115993 A1 * | 4/2015 | Wang | G01R 31/318513 257/48 |
| 2015/0212144 A1 * | 7/2015 | Ouyang | H01L 22/14 324/762.01 |
| 2018/0294230 A1 * | 10/2018 | Dabral | H01L 23/585 |
| 2018/0315672 A1 * | 11/2018 | Gassier | H01L 21/6835 |

* cited by examiner

*Primary Examiner* — Jermele M Hollington
*Assistant Examiner* — Temilade S Rhodes-Vivour
(74) *Attorney, Agent, or Firm* — Patterson + Sheridan, LLP

(57) ABSTRACT

Examples described herein generally relate to wafer testing and structures implemented on a wafer for wafer testing. In an example method for testing a wafer, power is applied to a first pad in a test site (TS) region on the wafer. The TS region is electrically connected to a device under test (DUT) region on the wafer. The DUT region includes a DUT. The TS region and DUT region are in a first and second scribe line, respectively, on the wafer. A third scribe line is disposed on the wafer between the TS region and the DUT region. A signal is detected from a second pad in the TS region on the wafer. The signal is at least in part a response of the DUT to the power applied to the first pad.

20 Claims, 8 Drawing Sheets

WAFER TESTING AND STRUCTURES FOR WAFER TESTING

TECHNICAL FIELD

Examples of the present disclosure generally relate to wafer testing and structures implemented on a wafer for wafer testing.

BACKGROUND

Integrated circuit (IC) dies typically include numerous electrical and/or electronic elements that are fabricated on, for example, silicon wafers to perform a particular function. After fabrication of IC dies on a wafer, a wafer acceptance test (WAT) is typically performed on the wafer. The WAT can identify defects or characteristics of devices that are tested. For example, if a misalignment occurred during a lithography step, a via or metal line may not contact or may contact with a small contact area, e.g., another via or metal line. The WAT can detect such a defect, for example, by the device being tested not forming a current loop (e.g., due to no contact being formed as a result of the misalignment) or by the device being tested having a high resistance (e.g., due to a small contact area being formed as a result of the misalignment). Also, for example, fabrication of the IC dies on the wafer can include processing that may not be uniform. Some areas on the wafer may be doped with a dopant to a higher concentration than other areas on the wafer. Such differences in dopant concentration can affect the relative performance of the IC dies fabricated on the wafer. The WAT can identify whether a device being tested indicates that performance of similar devices within some range from the device being tested are likely within some design specification.

SUMMARY

Examples described herein generally relate to wafer testing and structures implemented on a wafer for wafer testing. Examples described herein can permit obtaining a lower queue (Q) time for wafers being tested while testing as many or more devices under test (DUTs,) and/or can permit testing more DUTs while having a same Q time.

An example described herein is a method for testing a wafer. Power is applied to a first pad in a test site region on the wafer. The test site region is in a first scribe line on the wafer. The test site region is electrically connected to a first device under test region on the wafer. The first device under test region is in a second scribe line on the wafer and includes a first device under test. A third scribe line is disposed on the wafer between the test site region and the first device under test region. The third scribe line extends longitudinally in a direction that intersects with a direction that the first scribe line extends longitudinally. A first signal is detected from a second pad in the test site region on the wafer. The first signal is at least in part a response of the first device under test to the power applied to the first pad.

Another example described herein is a wafer. The wafer includes integrated circuit (IC) dies, a test site region, and a first device under test region. The IC dies have a scribe line disposed between neighboring IC dies of the IC dies. The test site region is in a first scribe line. The test site region includes a first pad and a second pad. The first scribe line extends longitudinally in a first direction. The first device under test region is in a second scribe line. The first device under test region includes a first device under test. A third scribe line is disposed between the test site region and the first device under test region. The third scribe line extends longitudinally in a second direction that intersects with the first direction. The test site region and the first device under test region are configured to provide a first signal at the second pad that is at least in part a response of the first device under test to power applied to the first pad.

Another example described herein is a method for forming a stacked die device. A first wafer is tested, and the first wafer is bonded to a second wafer. Testing the first wafer includes applying power to a first pad in a test site region on the first wafer and detecting a first signal from a second pad in the test site region. The first wafer includes integrated circuit dies separated by scribe lines. The test site region is disposed in a first scribe line of the scribe lines. The first signal is based on a response of a first device under test in a first device under test region to the power applied to the first pad. The first device under test region is electrically connected to the test site region across a second scribe line of the scribe lines that intersects the first scribe line.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
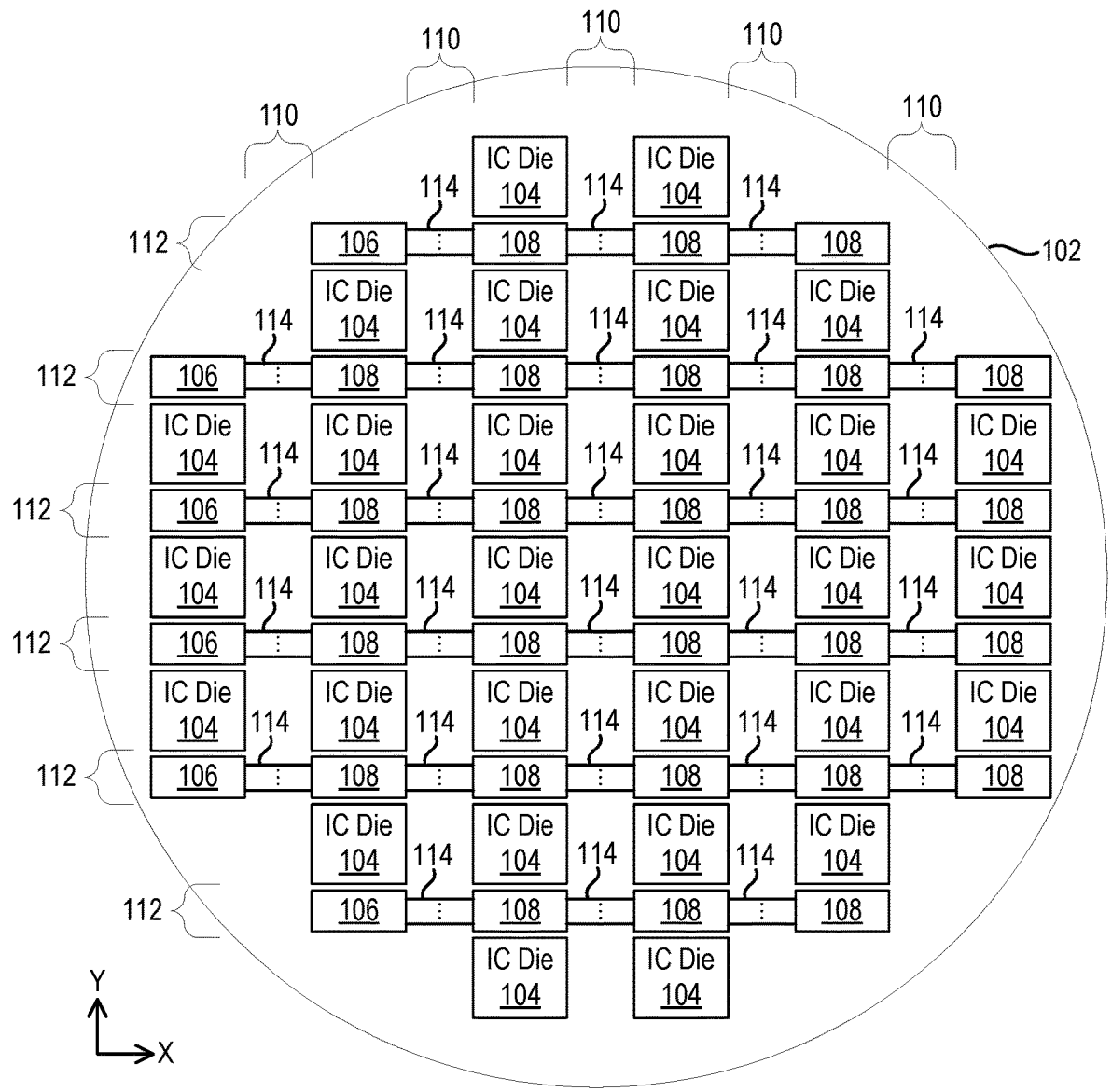
FIG. 1 depicts a simplified layout of a wafer according to some examples.

Examples described herein generally relate to wafer testing and structures implemented on a wafer for wafer testing.

Generally, according to various examples, a wafer includes a number of devices under test (DUTs) across the wafer. A probe of the wafer at a test site region during wafer testing can test DUTs in multiple different DUT regions across the wafer. The test site region can also include a DUT (and hence, can also be a DUT region). The test site region and the DUT regions can be disposed in one or more scribe lines. The DUT regions can be separated from the test site by one or more scribe lines (e.g., that intersect the one or more scribe lines in which the test site region and DUT regions are disposed).

Relative to previous wafer testing, examples described herein can permit obtaining a lower queue (Q) time for wafers being tested while testing as many or more DUTs, and/or can permit testing more DUTs while having a same Q time. For example, by probing one test site region to test multiple DUTs across a wafer, multiple probings that were previously performed can be obviated. Fewer steps of probe card placement between test site regions, fewer probes and extractions of the probe card, and fewer power up and down by the probe card can be implemented while testing just as many or more DUTs across the wafer.

A reduced Q time may be particularly beneficial for wafers that are to be wafer bonded to other wafers. Typically, wafer testing of a wafer to be wafer bonded occurs after formation of the top-most metal layer, which typically includes copper lines or vias. The wafer testing on such a wafer probes the metal lines or vias (e.g., copper lines or vias). Copper is susceptible to oxidation. A long Q time incurred during wafer testing can therefore lead to higher oxidation of the copper lines or vias in such a wafer. High oxidation of the copper lines or vias can result in high resistance of electrical paths formed by the oxidized copper lines or vias or failure of a bonding interface at the oxidized copper lines or vias. Having a reduced Q time can reduce the likelihood and/or extent of oxidation of copper lines or vias, and hence, can improve devices formed by wafer bonding wafers that have copper lines or vias in a top-most metal layer.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 depicts a simplified layout of a wafer 102 according to some examples. The wafer 102, as illustrated, has undergone Front End-of-Line (FEOL) and Back End-of-Line (BEOL), e.g., prior to being wafer bonded to another wafer. The wafer 102 has a number of integrated circuit (IC) dies 104, a number of combination test site (TS) and device under test (DUT) regions 106 (hereinafter, "TS/DUT region(s) 106"), and a number of DUT regions 108 formed thereon. In the illustrated example, the IC dies 104 are arranged in columns and rows on the wafer 102. A respective column scribe line 110 is on the wafer 102 between neighboring columns of the IC dies 104. In the illustrated example, each column scribe line 110 extends longitudinally in a y-direction, and the column scribe lines 110 extend longitudinally parallel to each other. A respective row scribe line 112 is on the wafer 102 between neighboring rows of the IC dies 104. In the illustrated example, each row scribe line 112 extends longitudinally in an x-direction, and the row scribe lines 112 extend longitudinally parallel to each other. Each y-direction that a column scribe line 110 longitudinally extends intersects with each x-direction that a row scribe line 112 longitudinally extends (e.g., although the respective scribe lines may not intersect). As a person having ordinary skill in the art will readily understand, the column scribe lines 110 and row scribe lines 112 are regions where dicing is to be performed to singulate the IC dies 104 from the remainder of the wafer 102.

In the illustrated examples, the TS/DUT regions 106 and DUT regions 108 are disposed in the row scribe lines 112 and are aligned with IC dies 104 in columns. In other examples, the arrangement of TS/DUT regions 106 and/or DUT regions 108 can differ. Stitch metal lines 114 are connected between and to neighboring TS/DUT regions 106 and/or DUT regions 108 within a row scribe line 112. In the illustrated example, the stitch metal lines 114 extend across a respective column scribe line 110 to electrically connect neighboring TS/DUT regions 106 and/or DUT regions 108 on opposing sides of the respective column scribe line 110 and within a same row scribe line 112. As noted the arrangement of TS/DUT regions 106 and/or DUT regions 108 can differ, and as such, so can the arrangement of stitch metal lines 114. Which TS/DUT regions 106 and/or DUT regions 108 that are electrically connected together can vary, and the electrical connections illustrated in FIG. 1 is merely an example. It is contemplated that, in some examples, the wafer 102 can have one TS/DUT region 106 and multiple DUT regions 108 at various locations across the wafer 102 (e.g., at each other location of a TS/DUT region 106 and DUT region 108 in the illustration), where the one TS/DUT region 106 is electrically connected to each of the DUT regions 108 such that probing the TS/DUT region 106 is capable of testing all DUTs on the wafer 102, as described in further detail below.

The stitch metal lines 114 electrically connect groups of TS/DUT region(s) 106 and/or DUT region(s) 108 together. Each group has at least one TS/DUT region 106 and includes one or more DUT region 108. Each group can include any number of DUT regions 108. As illustrated, each group is along a respective row scribe line 112. Groups can be arranged differently. A group can include many DUT regions electrically connected together (e.g., in parallel) across a wafer, such as greater than ten DUT regions. For example, a group can include one or more TS/DUT region(s) and nine or more DUT regions electrically connected together.

Each TS/DUT region 106 includes pads configured to be contacted by a probe card for wafer testing. In examples where the wafer 102 is to be bonded to another wafer, the pads can each be a pad (e.g., a metal pad, such as a copper pad) in a top metal layer formed on the wafer 102. In other examples, the pads can each be a pad (e.g., a metal pad, such as an aluminum pad) formed on a passivation layer on the top metal layer and on which external connectors (e.g., minibumps or the like) are to be formed. In some examples, each TS/DUT region 106 includes a DUT, while in other examples, the TS/DUT region 106 may not include a DUT.

Each DUT region 108 includes a DUT. In some examples, any DUT region 108 can include pads, which may be dummy pads, e.g., to permit for additional uniformity of processing of the wafer. In some examples, various ones or each DUT region 108 may instead or also be a TS/DUT region 106, which can permit flexibility in where a probe card can probe test sites on the wafer 102.

Each group of TS/DUT region(s) 106 and DUT regions 108 electrically connected together by stitch metal lines 114 is configured such that the DUTs included in the group are capable of being tested by a probe card probing the pads of the TS/DUT region 106 of the group. In some examples, DUTs in the group can be electrically connected to pads of the TS/DUT region 106 in parallel by the stitch metal lines 114. In further examples, one or more control circuits can be used to selectively electrically connect a given DUT to the stitch metal lines 114 such that the given DUT can be isolated for individual testing. In some examples, DUTs in the group can be electrically connected to pads of the TS/DUT region 106 in series by the stitch metal lines 114. In the illustrated example, the TS/DUT region 106 of each group is disposed at an end of the row of the corresponding group. In other examples, the TS/DUT region 106 can be disposed in other locations relative to other regions of the group.

Figure 2:
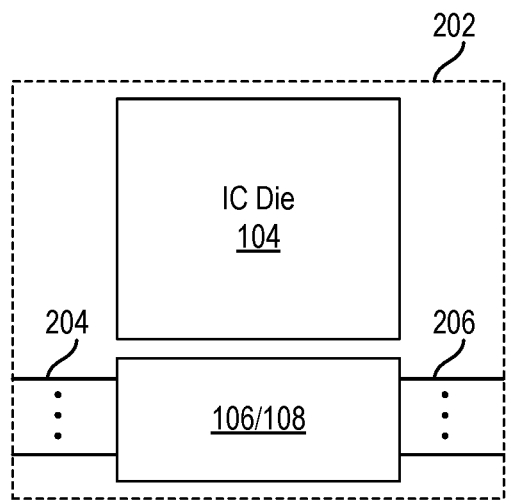
FIG. 2 depicts a reticle field of a mask to pattern according to some examples.

FIG. 2 depicts a reticle field 202 of a mask to pattern, e.g., a top metal layer according to some examples. The reticle field 202 includes first stitch line pattern portions 204 and second stitch line pattern portions 206. The first stitch line pattern portions 204, when the reticle field 202 is used in a lithography process, pattern a photosensitive material (e.g., photoresist) with lines in the photosensitive material that extend from the TS/DUT region 106 or DUT region 108 to an edge of the reticle field 202. Similarly, the second stitch line pattern portions 206, when the reticle field 202 is used in the lithography process, pattern the photosensitive material with lines in the photosensitive material that extend from the TS/DUT region 106 or DUT region 108 to an opposing edge of the reticle field 202. As will become apparent, each first stitch line pattern portion 204 aligns with a respective second stitch line pattern portion 206, and vice versa. For ease of reference, the edges of the reticle field 202 to which the first and second stitch line pattern portions 204, 206 extend are referenced as lateral edges of the reticle field 202.

Figure 3:
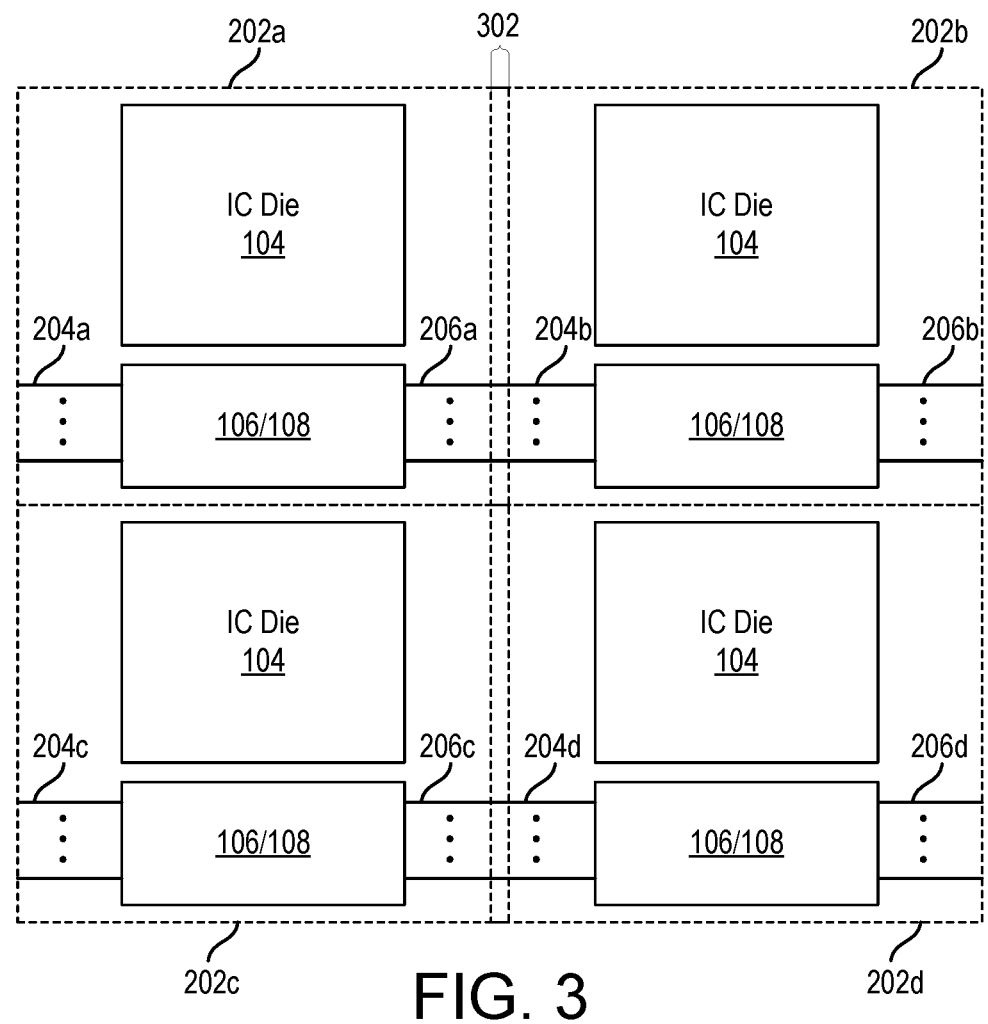
FIG. 3 depicts multiple reticle fields of the mask of FIG. 2 on the wafer after stepping the wafer through exposures using the mask according to some examples.

FIG. 3 depicts multiple reticle fields 202a, 202b, 202c, 202d of the mask on the wafer 102 after stepping the wafer 102 through exposures using the mask according to some examples. As shown in FIG. 3, laterally neighboring reticle fields overlap in an overlap region 302. Reticle field 202a and reticle field 202b overlap in the overlap region 302, and reticle field 202c and reticle field 202d overlap in the overlap region 302. In other examples, vertically neighboring reticle fields may overlap in addition to and/or instead of overlap of laterally neighboring reticle fields.

Since each first stitch line pattern portion 204 aligns with a respective second stitch line pattern portion 206, and vice versa, in the reticle field 202, where laterally neighboring reticle fields overlap, a first stitch line pattern portion 204 of one of the neighboring reticle fields overlaps with a second stitch line pattern portion 206 of the other of the neighboring reticle fields. This causes a continuous stitch metal line 114 to be formed between the neighboring reticle fields as a result of, at least in part, the lithography process. As illustrated, each first stitch line pattern portion 204b of reticle field 202b overlaps in overlap region 302 with a respective second stitch line pattern portion 206a of reticle field 202a, which results in stitch metal lines 114 being formed between the TS/DUT region(s) 106 and/or DUT region(s) 108 of the reticle fields 202a, 202b. Similarly, each first stitch line pattern portion 204d of reticle field 202d overlaps in overlap region 302 with a respective second stitch line pattern portion 206c of reticle field 202c, which results in stitch metal lines 114 being formed between the TS/DUT region(s) 106 and/or DUT region(s) 108 of the reticle fields 202c, 202d.

Figure 4:
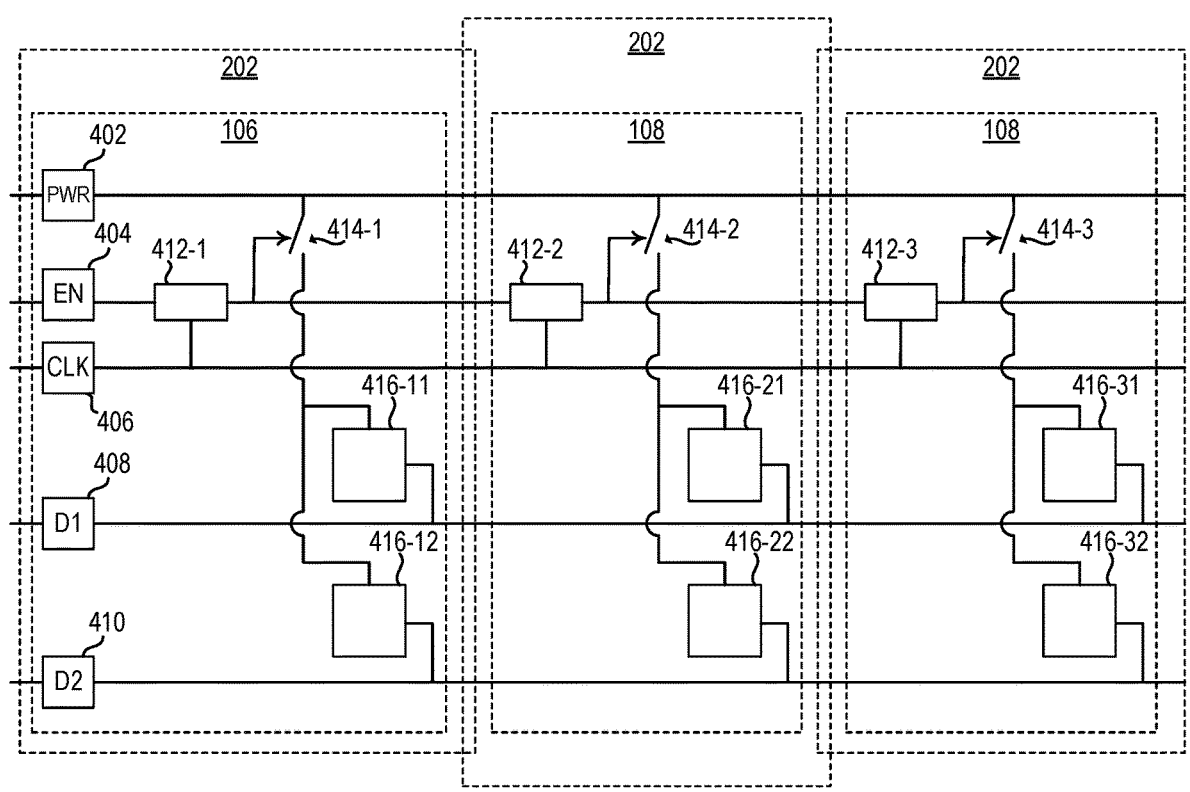
FIG. 4 illustrates a circuit schematic of a group of a test site (TS) and device under test (DUT) (TS/DUT) region and DUT regions electrically connected together by stitch metal lines according to some examples.

FIG. 4 illustrates a circuit schematic of a group of a TS/DUT region 106 and DUT regions 108 electrically connected together by stitch metal lines 114 according to some examples. In the example of FIG. 4, DUTs can be selectively electrically connected between pads (e.g., between a power pad and a signal or data pad), and, in some instances, no more than a single DUT is electrically connected between two pads at any given time which permits the DUTs to be individually tested. One TS/DUT region 106 and two DUT regions 108 are illustrated, although any number and combinations of TS/DUT regions 106 and DUT regions 108 can be implemented. FIG. 4 further illustrates reticle fields 202 for illustrative purposes, and stitch metal lines 114 form connections between the reticle fields 202, although the stitch metal lines 114 are not explicitly identified in FIG. 4.

The TS/DUT region 106 includes a power (PWR) pad 402, an enable (EN) pad 404, a clock (CLK) pad 406, a first data (D1) pad 408, and a second data (D2) pad 410. Respective nodes electrically connected to these pads are also referred to as PWR, EN, CLK, D1, and D2 nodes. It is noted that any number of pads may be implemented to test a DUT as appropriate. In some examples, a DUT in a DUT region can be a three terminal device, such as a transistor having a source, a drain, and a gate where a saturation current $I_{DSat}$ is measured. In such examples, a control pad that is electrically connected to the gate (e.g., separate from the PWR pad 402, D1 pad 408, and D2 pad) can be included.

Each TS/DUT region 106 and DUT region 108 includes a respective control circuit 412-1, 412-2, 412-3 (collectively or individually, control circuit(s) 412), a respective switch 414-1, 414-2, 414-3 (collectively or individually, switch(es) 414), a respective DUT 416-11, 416-21, 416-31 (collectively or individually, DUT(s) 416-x1), and a respective DUT 416-12, 416-22, 416-32 (collectively or individually, DUT(s) 416-x2). Except as noted below, the arrangement of the control circuit 412, switch 414, and DUTs 416-x1, 416-x2 is a same arrangement in each of the TS/DUT region 106 and DUT regions 108, and hence, to avoid repetition, the arrangement is described once. Each switch 414 can be a transistor (e.g., an n-type transistor), a transmission gate, or the like. Examples of the control circuits 412 are described below. Example DUTs 416-x1, 416-x2 include metal lines, vias, a capacitor, a p-n junction, a transistor, a diode, the like, or a combination thereof.

The switch 414 has a first terminal electrically connected to the PWR node. The switch 414 has a second terminal electrically connected to power input nodes of the DUTs 416-x1, 416-x2. A control input node of the switch 414 is electrically connected to an output node of the control circuit 412. A clock input node of the control circuit 412 is electrically connected to the CLK node. In examples where a DUT 416-x1 or 416-x2 is, e.g., a transistor, as stated above, a control pad can be electrically connected to a control node, which is further electrically connected to a control input node (e.g., a gate of the transistor) of the respective DUT 416-x1, 416-x2. Assuming the DUTs 416-x1, 416-x2 are each a transistor, the TS/DUT region 106 can include a first control (C1) pad and a second control (C2) pad. Each of the DUTs 416-x1 can have a respective control input node (e.g., a gate) connected to the C1 pad, and each of the DUTs 416-x2 can have a respective control input node (e.g., a gate) connected to the C2 pad.

The control circuits 412 of the TS/DUT region 106 and DUT regions 108 are serially electrically connected. An input enable node of the control circuit 412-1 is electrically connected to the EN node. An output node of the control circuit 412-1 (in addition to being electrically connected to the control input node of the switch 414-1) is electrically connected to an input enable node of the control circuit 412-2. An output node of the control circuit 412-2 (in addition to being electrically connected to the control input node of the switch 414-2) is electrically connected to an input enable node of the control circuit 412-3. Additional control circuits can be serially electrically connected if included in the group of the TS/DUT region 106 and DUT regions 108.

Generally, in operation of some examples, an enable signal can be asserted logically high and applied to the EN pad 404 for a duration corresponding to a time that a DUT in a given TS/DUT region 106 or DUT region 108 is to be tested. For example, the DUT of the group of the TS/DUT region 106 or DUT region 108 that is to be tested for the longest duration may determine the duration that the enable signal is asserted logically high at the EN pad 404. The enable signal is propagated serially through the control circuits 412 and is resultantly applied to the control input node of the switches 414 such that no more than one of the switches 414 of the group of the TS/DUT region 106 or DUT region 108 is closed at any given time. With no more than one of the switches 414 being closed at any given time, the DUTs of no more than one of the TS/DUT region 106 and DUT regions 108 can be tested at that time.

Figure 5:
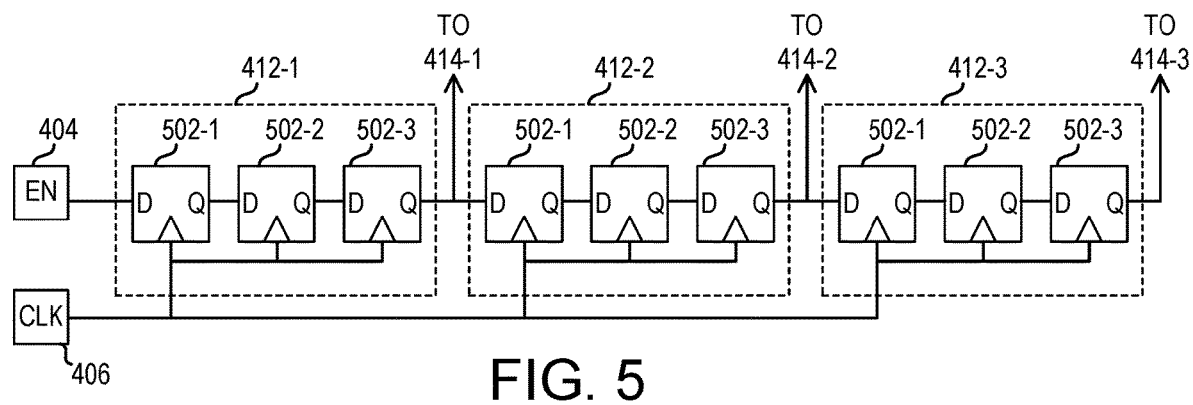
FIG. 5 illustrates a circuit schematic of control circuits of FIG. 4 according to some examples.

FIG. 5 illustrates a circuit schematic of control circuits 412 of the group of the TS/DUT region 106 and DUT regions 108 according to some examples. Each of the control circuits 412 includes a first flip-flop 502-1, a second flip-flop 502-2, and a third flip-flop 502-3. The first flip-flop 502-1, second flip-flop 502-2, and third flip-flop 502-3 are serially electrically connected. In each of the control circuits 412, an output node of the first flip-flop 502-1 is electrically connected to an input node of the second flip-flop 502-2; an output node of the second flip-flop 502-2 is electrically connected to an input node of the third flip-flop 502-3; and respective clock input nodes of the first flip-flop 502-1, second flip-flop 502-2, and third flip-flop 502-3 are electrically connected to the CLK node that is electrically connected to the CLK pad 406.

An input node of the first flip-flop 502-1 of the control circuit 412-1 (e.g., the input node of the control circuit 412-1) is electrically connected to the EN node, which is electrically connected to the EN pad 404. An output node of the third flip-flop 502-3 of the control circuit 412-1 (e.g., the output node of the control circuit 412-1) is electrically connected to the control input node of the switch 414-1 and to an input node of the first flip-flop 502-1 of the control circuit 412-2 (e.g., the input node of the control circuit 412-2). An output node of the third flip-flop 502-3 of the control circuit 412-2 (e.g., the output node of the control circuit 412-2) is electrically connected to the control input node of the switch 414-2 and to an input node of the first flip-flop 502-1 of the control circuit 412-3 (e.g., the input node of the control circuit 412-3). An output node of the third flip-flop 502-3 of the control circuit 412-3 (e.g., the output node of the control circuit 412-3) is electrically connected to the control input node of the switch 414-3 and any input node of a subsequent control circuit.

Figure 6:
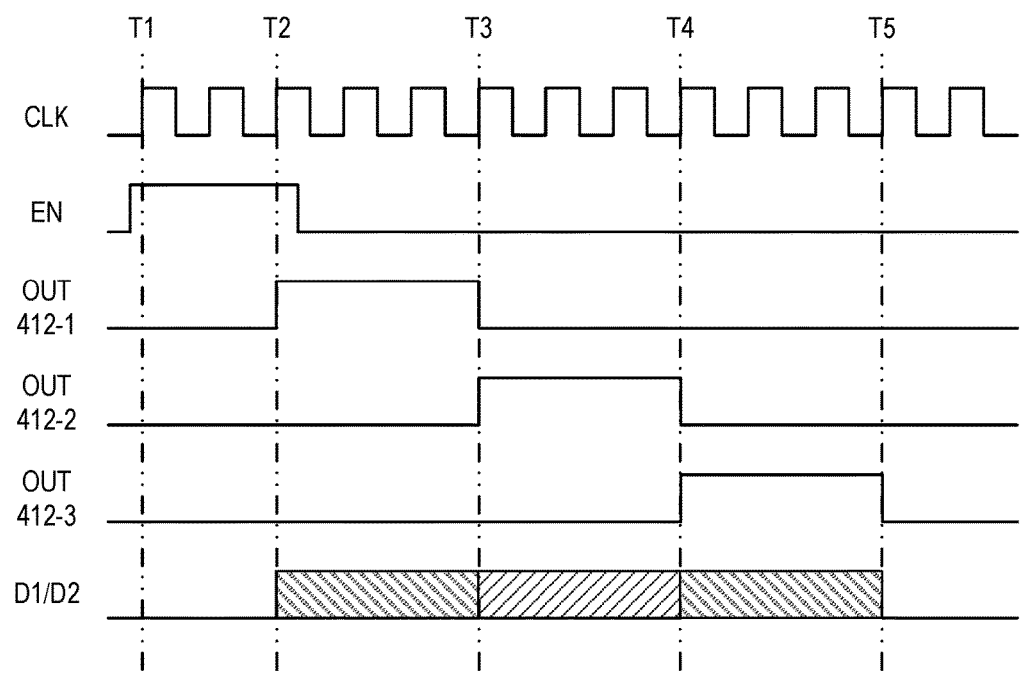
FIG. 6 illustrates a timing diagram of signals to illustrate an example operation of FIGS. 4 and 5 according to some examples.

FIG. 6 illustrates a timing diagram of signals to illustrate an example operation of the group of the TS/DUT region 106 and DUT regions 108 of FIGS. 4 and 5 according to some examples. FIG. 6 shows a CLK signal applied to the CLK pad 406 and an EN signal applied to the EN pad 404. The EN signal is logically high prior to the rising edge of the CLK signal at time T1 and falls to logically low subsequent to the rising edge of the CLK signal at time T2. The EN signal is logically high for three rising edges of the CLK signal starting at time T1 and ending at time T2.

At the rising edge of the CLK signal at time T1, the output signal of the first flip-flop 502-1 of the control circuit 412-1 transitions to logically high as a result of the EN signal being logically high. At the rising edge of the CLK signal at time T1 plus one clock cycle, the output signal of the second flip-flop 502-2 of the control circuit 412-1 transitions to logically high as a result of the output signal of the first flip-flop 502-1 of the control circuit 412-1 being logically high. At the rising edge of the CLK signal at time T1 plus two clock cycles (which is time T2), the output signal of the third flip-flop 502-3 of the control circuit 412-1 transitions to logically high as a result of the output signal of the second flip-flop 502-2 of the control circuit 412-1 being logically high. Hence, the output signal of control circuit 412-1 transitions to logically high at time T2, which closes the switch 414-1 at time T2 and inputs this logically high signal to the subsequent control circuit 412-2.

At the rising edge of the CLK signal at time T2 plus one clock cycle, the output signal of the first flip-flop 502-1 of the control circuit 412-2 transitions to logically high as a result of the output signal of the control circuit 412-1 being logically high. At the rising edge of the CLK signal at time T2 plus two clock cycles, the output signal of the second flip-flop 502-2 of the control circuit 412-2 transitions to logically high as a result of the output signal of the first flip-flop 502-1 of the control circuit 412-2 being logically high. At the rising edge of the CLK signal at time T2 plus three clock cycles (which is time T3), the output signal of the third flip-flop 502-3 of the control circuit 412-2 transitions to logically high as a result of the output signal of the second flip-flop 502-2 of the control circuit 412-2 being logically high. Hence, the output signal of control circuit 412-2 transitions to logically high at time T3, which closes the switch 414-2 at time T3 and inputs this logically high signal to the subsequent control circuit 412-3.

The rising edge of the EN signal similarly propagates through the control circuit 412-3 like described with respect to the control circuit 412-2 except at different times. A person having ordinary skill in the art will readily understand such operation, and as such, such description is omitted for brevity. The output signal of control circuit 412-3 transitions to logically high at time T4, which closes the switch 414-3 at time T4, and the control circuit 412-3 can input this logically high signal to any subsequent control circuit.

At the rising edge of the CLK signal at time T2 plus one clock cycle, the output signal of the first flip-flop 502-1 of the control circuit 412-1 transitions to logically low as a result of the EN signal transitioning to logically low subsequent to time T2. At the rising edge of the CLK signal at time T2 plus two clock cycle, the output signal of the second flip-flop 502-2 of the control circuit 412-1 transitions to logically low as a result of the output signal of the first flip-flop 502-1 of the control circuit 412-1 being logically low. At the rising edge of the CLK signal at time T2 plus three clock cycles (which is time T3), the output signal of the third flip-flop 502-3 of the control circuit 412-1 transitions to logically low as a result of the output signal of the second flip-flop 502-2 of the control circuit 412-1 being logically low. Hence, the output signal of control circuit 412-1 transitions to logically low at time T3, which opens the switch 414-1 at time T3 and inputs this logically low signal to the subsequent control circuit 412-2.

At the rising edge of the CLK signal at time T3 plus one clock cycle, the output signal of the first flip-flop 502-1 of the control circuit 412-2 transitions to logically low as a result of the output signal of the control circuit 412-1 being logically low. At the rising edge of the CLK signal at time T3 plus two clock cycles, the output signal of the second flip-flop 502-2 of the control circuit 412-2 transitions to logically low as a result of the output signal of the first flip-flop 502-1 of the control circuit 412-2 being logically low. At the rising edge of the CLK signal at time T3 plus three clock cycles (which is time T4), the output signal of the third flip-flop 502-3 of the control circuit 412-2 transitions to logically low as a result of the output signal of the second flip-flop 502-2 of the control circuit 412-2 being logically low. Hence, the output signal of control circuit 412-2 transitions to logically low at time T4, which opens the switch 414-2 at time T4 and inputs this logically low signal to the subsequent control circuit 412-3.

The falling edge of the EN signal similarly propagates through the control circuit 412-3 like described with respect to the control circuit 412-2 except at different times. A person having ordinary skill in the art will readily understand such operation, and as such, such description is omitted for brevity. The output signal of control circuit 412-3 transitions to logically low at time T5, which opens the switch 414-3 at time T5, and the control circuit 412-3 can input this logically low signal to any subsequent control circuit.

As described, the output signal of the control circuit 412-1 transitions from logically low to logically high at time T2, remains logically high from time T2 to time T3, and transitions from logically high to logically low at time T3. As a result, the switch 414-1 closes at time T2, remains closed from time T2 to time T3, and opens at time T3. The switch 414-1 being closed electrically connects the DUT 416-11 between the PWR pad 402 and the D1 pad 408 and electrically connects the DUT 416-12 between the PWR pad 402 and the D2 pad 410. Opening the switch 414-1 electrically disconnects the DUTs 416-11, 416-12 from between the PWR pad 402 and the D1 and D2 pads 408, 410. The signal received at the D1 pad 408 from time T2 to time T3 is therefore a test signal from the DUT 416-11 (e.g., a response of the DUT 416-11 to the power applied to the PWR pad 402), and the signal received at the D2 pad 410 from time T2 to time T3 is therefore a test signal from the DUT 416-12 (e.g., a response of the DUT 416-12 to the power applied to the PWR pad 402.

The output signal of the control circuit 412-2 transitions from logically low to logically high at time T3, remains logically high from time T3 to time T4, and transitions from logically high to logically low at time T4. As a result, the switch 414-2 closes at time T3, remains closed from time T3 to time T4, and opens at time T4. The switch 414-2 being closed electrically connects the DUT 416-21 between the PWR pad 402 and the D1 pad 408 and electrically connects the DUT 416-22 between the PWR pad 402 and the D2 pad 410. Opening the switch 414-2 electrically disconnects the DUTs 416-21, 416-22 from between the PWR pad 402 and the D1 and D2 pads 408, 410. The signal received at the D1 pad 408 from time T3 to time T4 is therefore a test signal from the DUT 416-21 (e.g., a response of the DUT 416-21 to the power applied to the PWR pad 402), and the signal received at the D2 pad 410 from time T3 to time T4 is therefore a test signal from the DUT 416-22 (e.g., a response of the DUT 416-22 to the power applied to the PWR pad 402).

The output signal of the control circuit 412-3 transitions from logically low to logically high at time T4, remains logically high from time T4 to time T5, and transitions from logically high to logically low at time T5. As a result, the switch 414-3 closes at time T4, remains closed from time T4 to time T5, and opens at time T5. The switch 414-3 being closed electrically connects the DUT 416-31 between the PWR pad 402 and the D1 pad 408 and electrically connects the DUT 416-32 between the PWR pad 402 and the D2 pad 410. Opening the switch 414-3 electrically disconnects the DUTs 416-31, 416-32 from between the PWR pad 402 and the D1 and D2 pads 408, 410. The signal received at the D1 pad 408 from time T4 to time T5 is therefore a test signal from the DUT 416-31 (e.g., a response of the DUT 416-31 to the power applied to the PWR pad 402), and the signal received at the D2 pad 410 from time T4 to time T5 is therefore a test signal from the DUT 416-32 (e.g., a response of the DUT 416-32 to the power applied to the PWR pad 402).

If the DUTs 416 are, e.g., respective transistors as noted above, the signals received at the D1 pad 408 and the D2 pad 410 at the respective times can further be a response based on a control signal applied at a respective control pad.

The above description of FIG. 5 and its operation with respect to FIG. 6 is provided as an example. A control circuit 412 can have any number of serially electrically connected flip-flops. In some examples, the control circuits 412 of the group of TS/DUT region(s) 106 and DUT regions 108 can each have a same number of flip-flops that are serially electrically connected, and in other examples, various ones of the control circuits 412 of the group of TS/DUT region(s) 106 and DUT regions 108 can have different numbers of flip-flops that are serially electrically connected.

In some examples, a longest duration that a DUT 416 of the group of TS/DUT region(s) 106 and DUT regions 108 to be tested can determine a minimum number of serially electrically connected flip-flops of the control circuits 412. As indicated by the preceding description, if a longest duration that a DUT 416 is to be tested is three clock cycles of the CLK signal, as illustrated, each of the control circuits 412 includes at least three serially electrically connected flip-flops. This permits the EN signal to be asserted logically high for three rising edges, which is propagated as described, to allow each DUT 416 to be individually tested for three clock cycles, e.g., without collision of signals from multiple DUTs 416 or simultaneous parallel electrical connections of multiple DUTs 416 to a same D1 pad 408 or D2 pad 410. In some examples, each DUT 416 is to be tested for a single clock cycle, and each control circuit 412 can be one flip-flop. In some examples, each DUT 416 is to be tested for two clock cycles, and each control circuit 412 can have two serially electrically connected flip-flops. Other examples can follow a similar pattern with other number of serially electrically connected flip-flops.

In some examples, each control circuit 412 of the group of TS/DUT region(s) 106 and DUT regions 108 can have one or more flip-flops in excess of the number of clock cycles that is the longest duration that a DUT 416 is to be tested. This can permit a corresponding one or more clock cycles separation between subsequent test signals received at the D1 pad 408 and at the D2 pad 410. For example, referring to FIGS. 5 and 6, assume that the DUTs 416 are each to be tested for two clock cycles, and the EN signal is logically high at the rising edges of the CLK signal at time T1 and time T1 plus one clock cycle before transitioning to logically low before time T2. The rising edge of the EN signal propagates through the control circuits 412 as described, as does the falling edge of the EN signal. However, the falling edge of the EN signal occurs one clock cycle earlier than previously described. This causes each of the output signals of control circuits 412-1, 412-2, 412-3 to fall one clock cycle earlier than previously described, which causes the respective switches 414-1, 414-2, 414-3 to open one clock cycle earlier than previously described. Hence, the signals received at the D1 pad 408 and D2 pad 410 from time T2 to time T2 plus two clock cycles are test signals from the DUTs 416-11, 416-12, respectively; the signals received at the D1 pad 408 and D2 pad 410 from time T3 to time T3 plus two clock cycles are test signals from the DUTs 416-21, 416-22, respectively; etc. One clock cycle is present between time T2 plus two clock cycles and time T3 where no test signal is received at the D1 pad 408 and D2 pad 410, and one clock cycle is present between time T3 plus two clock cycles and time T4 where no test signal is received at the D1 pad 408 and D2 pad 410. Other number of clock cycles for separation between test signals can be implemented.

Other control circuits can be implemented to selectively electrically connect DUTs between nodes. Various examples contemplate any appropriate control circuit. As an example, each control circuit can include an adder and a comparator. The adders can be configured to increment an address identifier of the TS/DUT region 106 or DUT region 108 in which the adder is disposed to obtain and provide the address identifier of the subsequent TS/DUT region 106 or DUT region 108. For example, a TS/DUT region 106 can have a ground pad. The ground pad can be, when probed, logically low, which causes the TS/DUT region 106 to have an address identifier of 0. The adder of the TS/DUT region 106 has this address identifier as an input and has another input node electrically connected to a VDD pad, which can be, when probed, logically high. The adder of the TS/DUT region 106 therefore increments the address identifier of the TS/DUT region 106 by one and outputs the added result to the subsequent DUT region 108 to be the address identifier of that DUT region 108. Each DUT region 108 receives its address identifier from the preceding TS/DUT region 106 or DUT region 108, increments that address identifier, and provides the added result to the subsequent DUT region 108 to be the address identifier of that DUT region 108. Metal lines (electrically connected to respective pads of the TS/DUT region 106) can extend across the TS/DUT region 106 and DUT regions 108 as address lines, which are electrically connected to respective input nodes of the comparator. The comparator is configured to compare the address identifier to the address provided by the metal lines. When the address identifier of the TS/DUT region 106 or DUT region 108 matches the address provided by the metal lines, the comparator is configured to cause the switch 414 of the TS/DUT region 106 or DUT region 108 to close. Such a configuration can allow each TS/DUT region 106 and DUT region 108 to be controlled individually without regard to timing or a clock signal.

Figure 7:
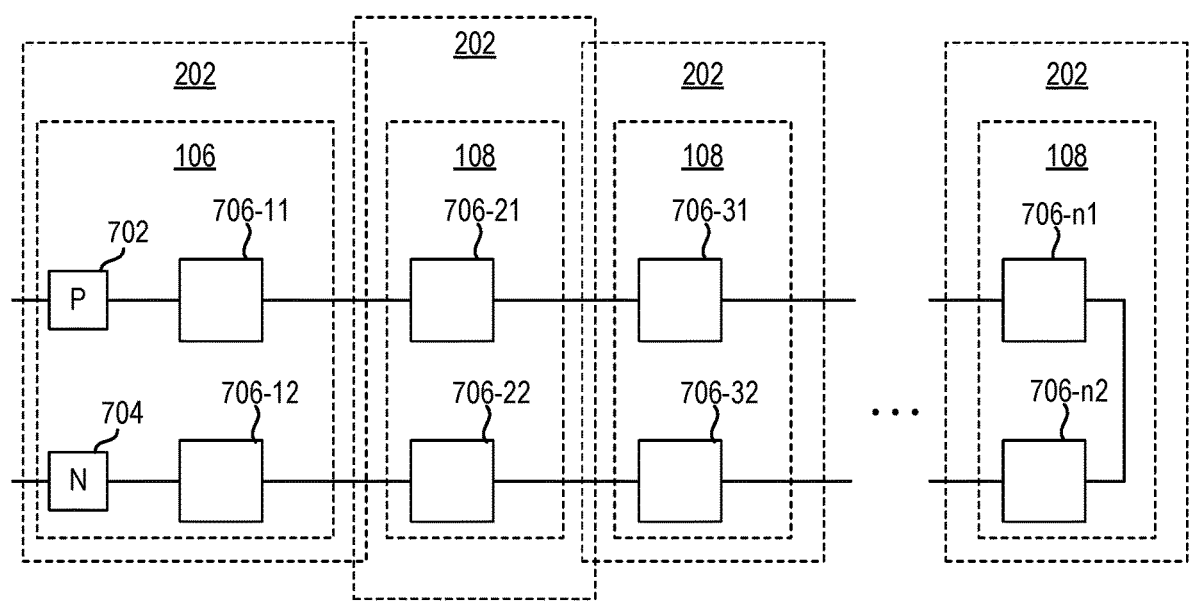
FIG. 7 illustrates another circuit schematic of a group of a TS/DUT region and DUT regions electrically connected together by stitch metal lines according to some examples.

FIG. 7 illustrates another circuit schematic of a group of a TS/DUT region 106 and DUT regions 108 electrically connected together by stitch metal lines 114 according to some examples. In the example of FIG. 7, DUTs are serially electrically connected together such that the DUTs are tested together to obtain a combined response of the DUTs. One TS/DUT region 106 and three DUT regions 108 are illustrated, although any number and combinations of TS/DUT regions 106 and DUT regions 108 can be implemented. FIG. 7 further illustrates reticle fields 202 for illustrative purposes, and stitch metal lines 114 form connections between the reticle fields 202, although the stitch metal lines 114 are not explicitly identified in FIG. 7.

The TS/DUT region 106 includes a positive (P) pad 702 and a negative (N) pad 704. Respective nodes electrically connected to these pads are also referred to as P and N nodes. Each TS/DUT region 106 and DUT region 108 includes a respective DUT 706-11, 706-21, 706-31, . . . 706-$n$1 (collectively or individually, DUT(s) 706-$x$1), and a respective DUT 706-12, 706-22, 706-32, . . . 706-$n$2 (collectively or individually, DUT(s) 706-$x$2). Example DUTs 706-$x$1, 706-$x$2 include metal lines and/or vias.

The DUTs 706-$x$1, 706-$x$2 are serially electrically connected between the P pad 702 and the N pad 704. A first terminal of the DUT 706-11 is electrically connected to the P node, and a second terminal of the DUT 706-11 (opposite from the first terminal) is electrically connected to a first terminal of the DUT 706-21. A second terminal of the DUT 706-21 (opposite from the first terminal) is electrically connected to a first terminal of the DUT 706-31. Similarly, a first terminal of the DUT 706-12 is electrically connected to the N node, and a second terminal of the DUT 706-12 (opposite from the first terminal) is electrically connected to a first terminal of the DUT 706-22. A second terminal of the DUT 706-22 (opposite from the first terminal) is electrically connected to a first terminal of the DUT 706-32. Such serial electrical connections continue for subsequent DUT regions 108 until a loop-back DUT region 108 is reached. At the loop-back DUT region 108, a second terminal of the DUT 706-$n$1 is electrically connected to a second terminal of the DUT 706-$n$2.

In operation, the P pad 702 and N pad 704 can be probed. Power can be applied to the P pad 702, and a signal can be detected from the N pad 704. An electrical current flowing from the N pad 704 and/or a voltage difference between the P pad 702 and the N pad 704 can be determined to identify any defects in the DUTs 706 and/or a resistance of the serially electrically connected DUTs 706. Implementing a large metal line and via chain as the DUTs 706 across a wafer 102 can permit obtaining results that better reflect a product yield of the IC dies 104 of the wafer 102.

Figure 8:
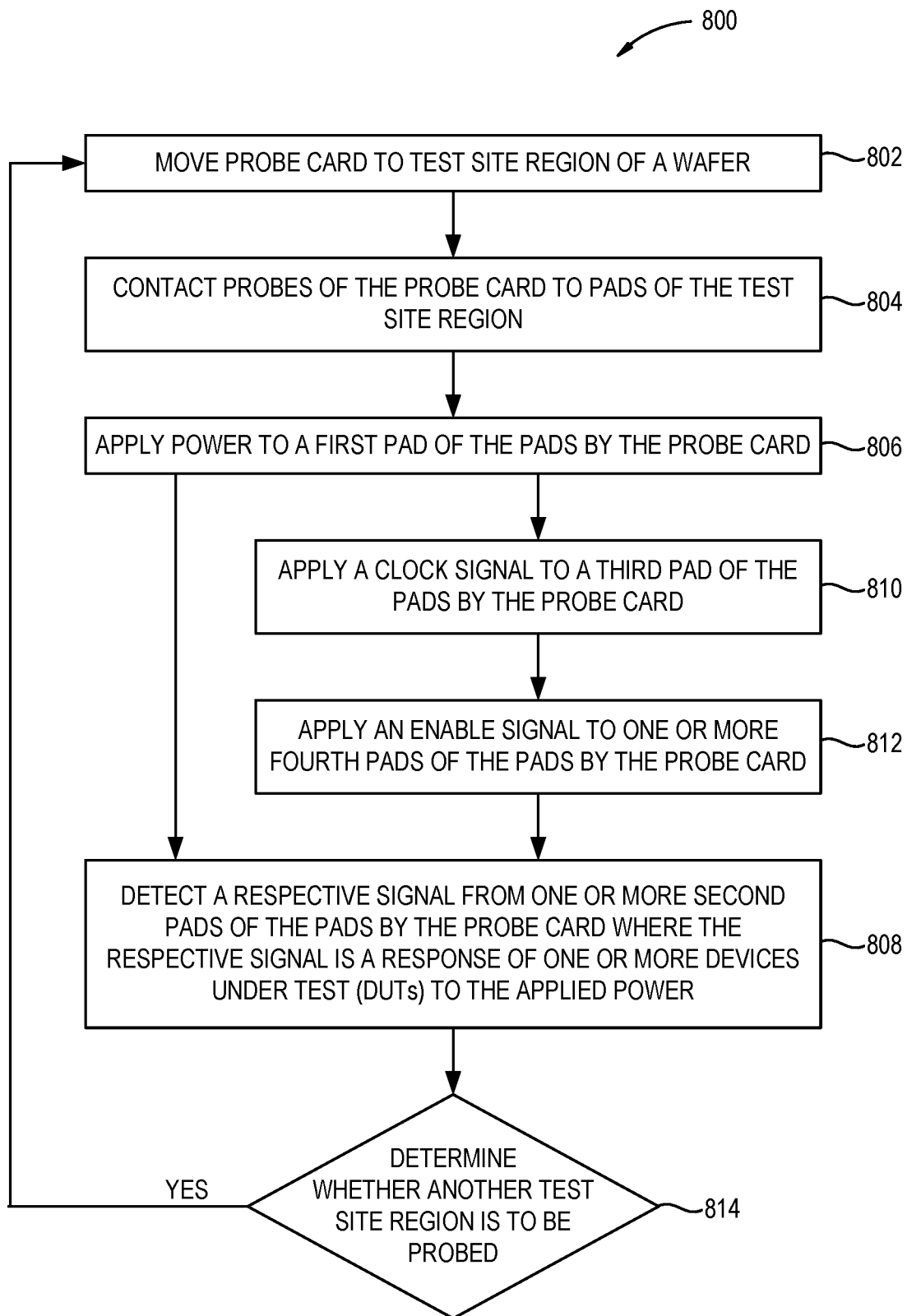
FIG. 8 is a flowchart of a method of performing wafer testing according to some examples.

FIG. 8 is a flowchart of a method 800 of performing wafer testing according to some examples. The method 800 of FIG. 8 is described in the context of the examples of FIGS. 1, 4, and 7 for clarity, although the method 800 can be practiced with other examples.

At block 802, a probe card is moved (e.g., stepped) to a test site region of a wafer. The test site region can also include a DUT, and hence, can be a TS/DUT region (e.g., TS/DUT region 106). As described above with respect to FIG. 1, a TS/DUT region 106 and one or more DUT regions 108 are electrically connected together. The TS/DUT region 106 and DUT regions 108 can be disposed in a row scribe line 112 and can be separated by respective column scribe lines 110, as an example.

At block 804, probes of the probe card contact pads of the test site region. Like described above, a TS/DUT region 106 can have pads 402, 404, 406, 408, 410 and/or pads 702, 704. These pads of the TS/DUT region 106 can be contacted by the probes of the probe card.

At block 806, power is applied to a first pad of the pads by the probe card. For example, power can be applied to PWR pad 402 and P pad 702 in the examples of FIGS. 4 and 7. The power may be in the form of, e.g., a current source or a voltage source.

In some examples, a response to the power can be detected simply by detecting a signal from another pad. In such examples, at block 808, a respective signal is detected from one or more second pads of the pads by the probe card. The respective signal is a response of one or more DUTs to the applied power. For example, referring to FIG. 7, the DUTs 706 of the TS/DUT region 106 and DUT regions 108 are serially electrically connected. Where these DUTs 706 are, e.g., metal line and via chains and power is applied to P pad 702, a signal detected at pad 704 can be a combined response of the DUTs 706. The signal can indicate, e.g., a misalignment of a via or metal line that breaks the electrical loop (e.g., such that the signal is no voltage and no current detected at the pad 704) or can indicate a combined serial resistance of the chains.

In some examples, a response to the power is further enabled by other signals applied to other pads, and the response can be detected by detecting a signal from still another pad. In such examples, at block 810, a clock signal is applied to a third pad of the pads by the probe card. For example, referring to FIG. 4, a clock signal is applied to CLK pad 406. At block 812, an enable signal is applied to one or more fourth pads of the pads by the probe card. For example, referring to FIG. 4, an enable signal is applied to EN pad 404. At block 808, a respective signal is detected from one or more second pads of the pads by the probe card. For example, referring to FIGS. 4 through 6, the DUTs 416 are selectively electrically connected between the PWR pad 402 and the D1 pad 408 or D2 pad 410 (via respective switches 414) based on the propagation of the EN signal through the control circuits 412. As described above in the example of FIG. 6, switch 414-1 selectively electrically connects DUT 416-11 between the PWR pad 402 and the D1 pad 408 during the time period between time T2 and time T3, and selectively electrically connects DUT 416-12 between the PWR pad 402 and the D2 pad 410 during the time period between time T2 and time T3. Switch 414-2 selectively electrically connects DUT 416-21 between the PWR pad 402 and the D1 pad 408 during the time period between time T3 and time T4, and selectively electrically connects DUT 416-22 between the PWR pad 402 and the D2 pad 410 during the time period between time T3 and time T4. Switch 414-3 selectively electrically connects DUT 416-31 between the PWR pad 402 and the D1 pad 408 during the time period between time T4 and time T5, and selectively electrically connects DUT 416-32 between the PWR pad 402 and the D2 pad 410 during the time period between time T4 and time T5. Hence, a signal detected at the D1 pad 408 between time T2 and time T3 is a response of the DUT 416-11, between time T3 and time T4 is a response of the DUT 416-21, and between time T4 and time T5 is a response of the DUT 416-31. A signal detected at the D2 pad 410 between time T2 and time T3 is a response of the DUT 416-12, between time T3 and time T4 is a response of the DUT 416-22, and between time T4 and time T5 is a response of the DUT 416-32.

In further examples, such as where the DUTs 416 are transistors, a control signal can be applied to one or more fifth pads of the pads by the probe card. The respective signal is detected from one or more second pads of the pads by the probe card at block 808 can also be based on the control signal. Other and/or additional pads and signals can be implemented based on the type of DUT.

As indicated by the above description of blocks 806-812, depending on a configuration of the TS/DUT region 106 and DUT regions 108, a response can be a combined response of multiple DUTs or can be a response of a single DUT. In some examples, the TS/DUT region 106 and DUT regions 108 can include any number of permutations or configurations and can include configurations where some DUTs are tested individually (e.g., a response of a single DUT (and no other DUT) is detected) and some DUTs are tested in combination (e.g., a combined response of multiple DUTs is detected). Hence, in some examples, the respective examples where block 806-808 and where blocks 806-812 are performed as described above are performed by a same probing of a given test site region.

At block 814, a determination is made whether another test site region is to be probed. If so, the probe card is moved to that test site region, at block 802, and the performance of the blocks continues as described above. This loop may continue until all of the test site regions on the wafer have been probed.

The signals obtained by the wafer testing can be compared against a design specification. If the signals are within the design specification, the wafer that is tested can be accepted and used for subsequent processing (e.g., bonding in some examples described below and/or singulation and packaging). If the signals are not within the design specification, the wafer that is tested can be discarded.

Figure 9:
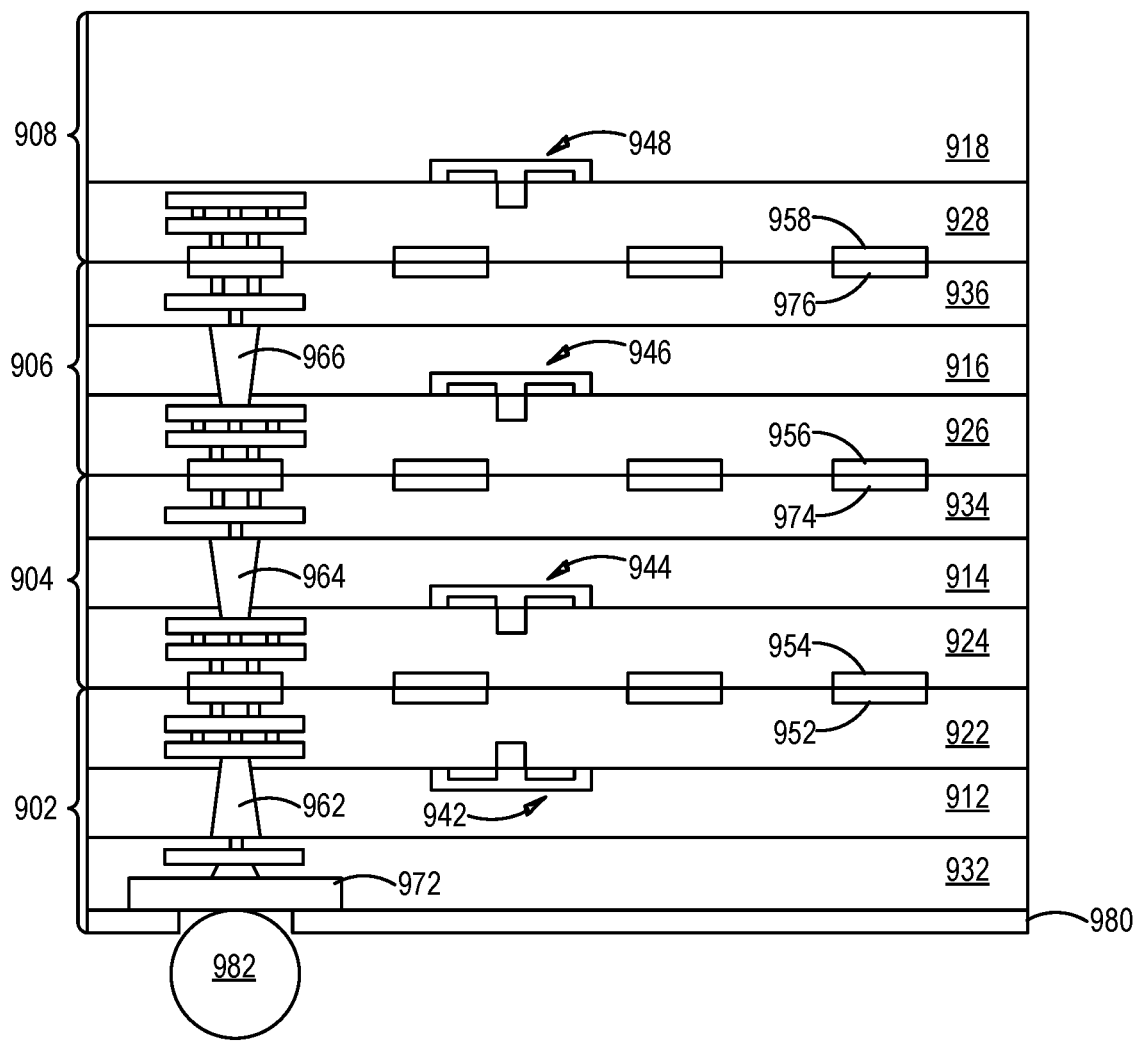
FIG. 9 is a structure of a multi-die device according to some examples.

FIG. 9 is a structure of a multi-die device according to some examples. The multi-die device of FIG. 9 includes an IC die stack that includes a base IC die 902, intermediate IC dies 904, 906, and a distal IC die 908. The base IC die 902, intermediate IC dies 904, 906, and distal IC die 908 are described herein as examples. Aspects described herein can be generally applicable to IC dies of a multi-die device having any type of IC or component.

In the multi-die device of FIG. 9, the intermediate IC dies 904, 906 and distal IC die 908 are arranged active or front side facing down towards the base IC die 902, where the base IC die 902 is arranged active or front side facing up towards the intermediate IC dies 904, 906 and distal IC die 908. In other multi-die devices, the intermediate IC dies 904, 906 are arranged active or front side facing up away from the base IC die 902, and the distal IC die 908 is arranged active or front side facing down towards the base IC die 902, where the base IC die 902 is arranged active or front side facing up towards the intermediate IC dies 904, 906 and distal IC die 908. Various other multi-die devices can have different structures, different number of IC dies, additional components, etc.

Generally, the IC dies 902-908 are stacked and form an IC die stack in the multi-die device. The IC dies 902-908 are stacked to form, in some examples, an Active die-on-Active die (AoA) device. Each of the IC dies 902-908 can include an active IC. In some examples, more or fewer IC dies can be included in the IC die stack. For example, a multi-die device can have two IC dies (such as a base IC die and a distal IC die), can have three IC dies (such as a base IC die, an intermediate IC die, and a distal IC die), or can have four or more IC dies (such as a base IC die, two or more intermediate IC dies, and a distal IC die). In some examples, a multi-die device can have three IC dies, four IC dies, five IC dies, etc.

Each of the IC dies 902-908 includes a respective semiconductor substrate 912, 914, 916, 918 and respective front side dielectric layer(s) 922, 924, 926, 928 on a front side of the respective semiconductor substrate 912-918. The front side dielectric layer(s) 922-928 include metallization (e.g., metal lines and/or vias) (illustrated but not specifically numbered) formed therein which can electrically connect various components in an IC. Each of the IC dies 902-906 includes respective backside dielectric layer(s) 932, 934, 936 on a backside of the respective semiconductor substrate 912-916. The backside dielectric layer(s) 932-936 include metallization (e.g., metal lines and/or vias) (illustrated but not specifically numbered) formed therein which can electrically connect various components in an IC. As illustrated, metallization in front side dielectric layer(s) 924, 926, 928 of the intermediate IC dies 904, 906 and distal IC die 908 connect to respective circuit regions of the intermediate IC dies 904, 906 and distal IC die 908 in which respective active circuits can be formed.

Each semiconductor substrate 912-918 of the IC dies 902-908 includes, e.g., a transistor 942, 944, 946, 948 formed on and/or in the front side surface of the respective semiconductor substrate 912-918. The transistor 942-948 and any other components can be connected to the metallization in the front side dielectric layer(s) 922-928. Each semiconductor substrate 912-916 of the respective IC die 902-906 has backside through-substrate via(s) (TSV(s)) 962, 964, 966 therethrough, which can electrically connect the metallization in the front side dielectric layer(s) 922-926 to the metallization in the backside dielectric layer(s) 932-936 of the respective IC die 902-906.

Front side bond pads 952, 954, 956, 958 (e.g., metal (e.g., Cu) bond pads) are formed in the respective front side dielectric layer(s) 922-928 of the IC dies 902-908 at an exterior surface distal from the respective semiconductor substrate 912-918. The front side bond pads 952-958 can be in an arrangement that forms a respective die-to-die interface. The front side bond pads 952-958 are connected to the metallization in the respective front side dielectric layer(s) 922-928. Backside bond pads 974, 976 (e.g., metal (e.g., Cu) bond pads) are formed in the respective backside dielectric layer(s) 934, 936 of the intermediate IC dies 904, 906 at an exterior surface distal from the respective semiconductor substrate 914, 916. The backside bond pads 974, 976 can be in an arrangement that forms a respective die-to-die interface. The backside bond pads 974, 976 are connected to the metallization in the respective backside dielectric layer(s) 934, 936.

Exterior connector backside pads 972 (e.g., metal (e.g., aluminum) pads) are formed in the backside dielectric layer(s) 932 of the base IC die 902 at an exterior surface distal from the semiconductor substrate 912 of the base IC die 902. The exterior connector backside pads 972 are connected to the metallization in the backside dielectric layer(s) 932 of the base IC die 902. A passivation layer 980 is formed on the exterior surface distal from the semiconductor substrate 912 of the base IC die 902 with respective openings therethrough exposing the exterior connector backside pads 972. External connectors 982 (e.g., controlled collapse chip connections (C4), minibumps, etc.) are formed on respective exterior connector backside pads 972 through the openings in the passivation layer 980.

The external connectors 982 can be attached to a package substrate. The package substrate may further be attached to, e.g., a printed circuit board (PCB) to attach the package substrate (and hence, the multi-die device) to the PCB. Various other components can be included in a multi-die device. For example, an interposer, an encapsulant (such as a molding compound (MUF) or the like), etc. can be included in the multi-die device. A person having ordinary skill in the art will readily envision various modifications that can be made to the multi-die device.

The IC dies 902-908 are bonded (e.g., by hybrid bonding using metal-to-metal and oxide-to-oxide bonding) together to form an IC die stack. The base IC die 902 is bonded to the intermediate IC die 904 front side to front side such that the front side bond pads 952 and exterior surface of the front side dielectric layer(s) 922 of the base IC die 902 are bonded to the front side bond pads 954 and exterior surface of the front side dielectric layer(s) 924 of the intermediate IC die 904. The intermediate IC die 904 is bonded to the intermediate IC die 906 backside to front side such that the backside bond pads 974 and exterior surface of the backside dielectric layer(s) 934 of the intermediate IC die 904 are bonded to the front side bond pads 956 and exterior surface of the front side dielectric layer(s) 926 of the intermediate IC die 906. The intermediate IC die 906 is bonded to the distal IC die 908 backside to front side such that the backside bond pads 976 and exterior surface of the backside dielectric layer(s) 936 of the intermediate IC die 906 are bonded to the front side bond pads 958 and exterior surface of the front side dielectric layer(s) 928 of the distal IC die 908.

Other arrangements of bonding can be implemented. For example, the base IC die 902 can be bonded to the intermediate IC die 904 front side to backside such that the front side bond pads 952 and exterior surface of the front side dielectric layer(s) 922 of the base IC die 902 are bonded to the backside bond pads 974 and exterior surface of the backside dielectric layer(s) 934 of the intermediate IC die 904. The intermediate IC die 904 can be bonded to the intermediate IC die 906 front side to backside such that the front side bond pads 954 and exterior surface of the front side dielectric layer(s) 924 of the intermediate IC die 904 are bonded to the backside bond pads 976 and exterior surface of the backside dielectric layer(s) 936 of the intermediate IC die 906. The intermediate IC die 906 can be bonded to the distal IC die 908 front side to front side such that the front side bond pads 956 and exterior surface of the front side dielectric layer(s) 926 of the intermediate IC die 906 are bonded to the front side bond pads 958 and exterior surface of the front side dielectric layer(s) 928 of the distal IC die 908.

In other examples, the IC dies 902-908 can be attached together using external connectors (such as minibumps, solder, etc.). In some examples, some of the IC dies 902-908 can be attached together by external connectors while others of the IC dies can be bonded together without use of external connectors. Any permutation of bonding and use of external connectors can be implemented.

In some examples, the base IC die 902 includes an interconnect that is capable of transmitting signals generally horizontally (e.g., parallel to the front side surface of the semiconductor substrate 912). The interconnect can be electrically and communicatively coupled to the other IC dies of the IC die stack. Signals can be transmitted in the interconnect of the base IC die 902 and then vertically (through metallizations and TSVs of various IC dies) to an appropriate target IC die in the IC die stack. Additionally, the base IC die 902 includes appropriate input/output circuits for receiving signals from a source and/or transmitting signals to a destination outside of the IC die stack of the multi-die device. The base IC die 902 can further include other circuits. For example, the base IC die 902 can be or include a processing IC and may further be a System-on-Chip (SoC).

In some examples, each of the intermediate IC dies 904, 906 and distal IC die 908 includes a processing IC (such as a fabric IC and compute IC). A processing IC can generally include any circuit configured to or configurable to process any data and/or signal and output data and/or a signal resulting from that processing, and is more than merely memory and any circuit ancillary to memory (e.g., address decoder, memory controller, etc.). The processing IC of the intermediate IC dies 904, 906 can be a same IC in some examples. The hardware topology, architecture, and layout of the intermediate IC dies 904, 906 can be the same in some examples. In some examples, the processing IC of the intermediate IC dies 904, 906 includes one or more programmable logic regions (e.g., fabric of a field programmable gate array (FPGA)), which has the same hardware topology, architecture, and layout between the intermediate IC dies 904, 906. In other examples, the intermediate IC dies 904, 906 are different ICs.

The distal IC die 908 can be or include any IC. For example, the distal IC die 908 can be or include a processing IC or memory. In some examples, the distal IC die 908 is an application specific IC (ASIC). In some examples, the distal IC die 908 is a same processing IC as one or both of the intermediate IC dies 904, 906 except without, e.g., TSVs and backside dielectric layer(s) and metallizations therein. In other examples, the intermediate IC dies 904, 906 and distal IC dies 908 can each be a different IC. In still other examples, the IC dies 904-908 can each be or include any permutation of being or including a same IC and/or different ICs. Any intermediate IC die 904, 906 or distal IC die 908 may generically be referred to as an active IC die.

Figure 10:
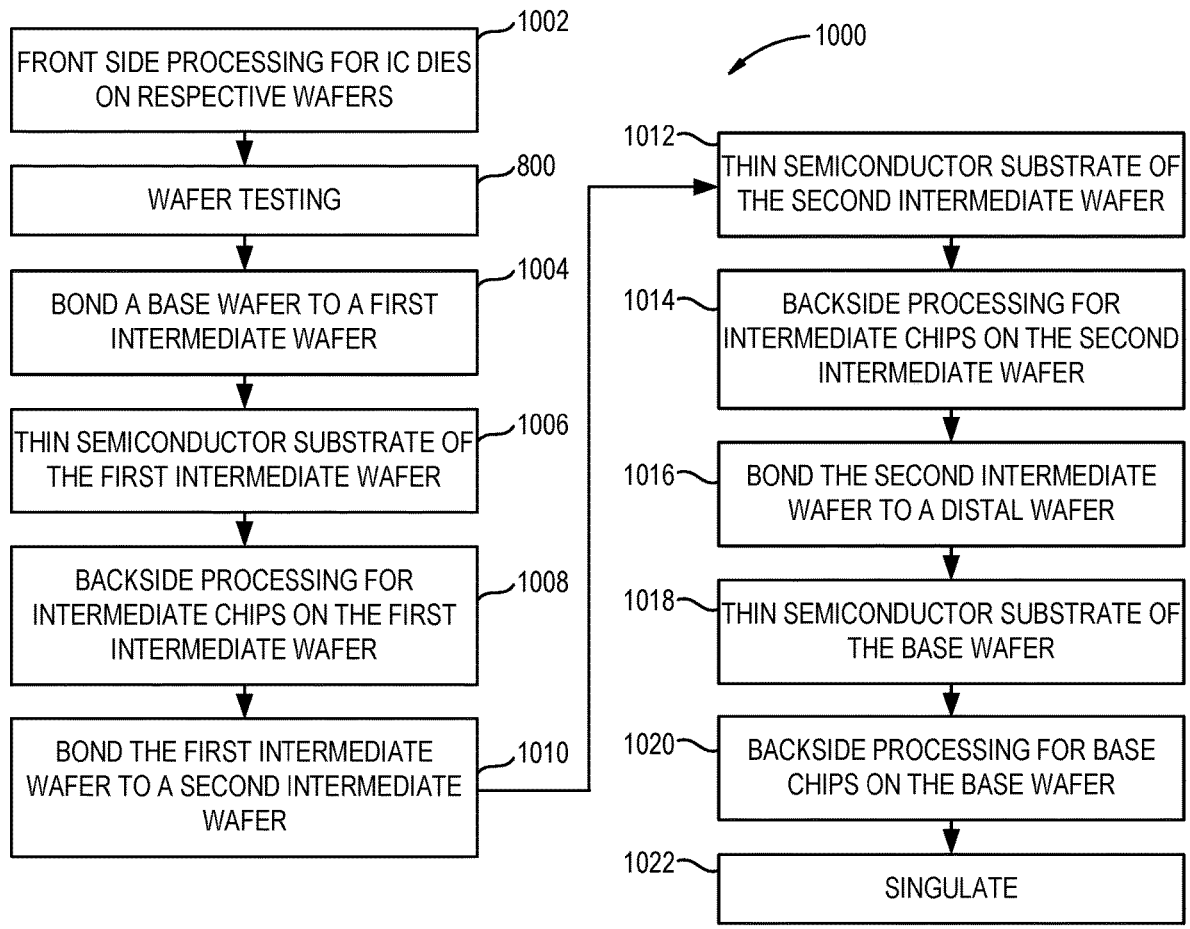
FIG. 10 is a flowchart of a method of forming the multi-die device of FIG. 9 according to some examples.

FIG. 10 is a flowchart of a method 1000 of forming the multi-die device of FIG. 9 according to some examples. A person having ordinary skill in the art will readily understand modifications to achieve other multi-die devices. The processing of the method 1000 of FIG. 10 is generally described, and a person having ordinary skill in the art will readily understand the more specific processing that can be performed. The more specific processing can be according to any semiconductor processing for forming an IC on substrate, which is to be singulated into an IC die. For ease of description herein, a wafer on which one or more base IC dies 902 are formed is referred to as a base wafer; a wafer on which one or more intermediate IC dies 904, 906 are formed is referred to as an intermediate wafer; and a wafer on which one or more distal IC dies 908 are formed is referred to as a distal wafer. Any wafer can be any shape and/or size.

At block 1002, front side processing for IC dies on the respective wafers is performed. For example, front side processing of each semiconductor substrate 912, 914, 916, 918 (e.g., wafer) can include forming devices (e.g., transistors 942, 944, 946, 948) in and/or on the front surface of the semiconductor substrate 912, 914, 916, 918, and forming front side dielectric layer(s) 922, 924, 926, 928 with metallizations and front side bond pads 952, 954, 956, 958 on the front surface of the semiconductor substrate 912, 914, 916, 918. Multiple base IC dies 902 can be formed on a base wafer. Multiple intermediate IC dies 904, 906 can be formed on each of a plurality of intermediate wafers. Multiple distal IC dies 908 can be formed on a distal wafer. Each of the wafers can generally have a layout as shown in FIG. 1 and can include TS/DUT regions 106 and DUT regions 108 in scribe lines for wafer testing. Examples of the TS/DUT regions 106 and DUT regions 108 are described above.

At method 800, the wafers are tested, like described above with respect to FIG. 8. The performance of the method 800 can have a reduced Q time, which can reduce oxidation of the front side bond pads 952, 954, 956, 958, for example. Wafers that fail the testing can be discarded, while wafers that pass the testing can be used in subsequent bonding. This can increase a yield of the bonded structure.

At block 1004, a base wafer is bonded to a first intermediate wafer, such as front side to front side bonding as shown in FIG. 9. As a result of the bonding, a front side of a base IC die 902 is bonded to a front side of an intermediate IC die 904, as shown in FIG. 9. The bonding can be hybrid bonding, such as bonding front side bond pads 952 on the base wafer to front side bond pads 954 on the first intermediate wafer, and bonding the exterior surface of the front side dielectric layer(s) 922 on the base wafer to the exterior surface of the front side dielectric layer(s) 924 on the first intermediate wafer.

At block 1006, the semiconductor substrate of the first intermediate wafer is thinned from a backside of the first intermediate wafer. As show in FIG. 9, the semiconductor substrate 914 of the intermediate IC die 904 is thinned from the backside. The thinning can be by a chemical mechanical polish (CMP) or other appropriate process. At block 1008, backside processing for intermediate IC dies on the first intermediate wafer is performed. As illustrated by FIG. 9, the backside processing can include forming backside TSVs 964 through the semiconductor substrate 914 of the first intermediate wafer and connecting to metallization in the front side dielectric layer(s) 924 on the first intermediate wafer. The backside processing can further include forming backside dielectric layer(s) 934 with metallizations and backside bond pads 974 on the backside of the semiconductor substrate 914. The metallizations in the backside dielectric layer(s) 934 can be connected to the metallizations in the front side dielectric layer(s) 924 through the backside TSVs 964.

At block 1010, the first intermediate wafer is bonded to a second intermediate wafer, such as backside to front side bonding as shown in FIG. 9. As a result of the bonding, a backside of an intermediate IC die 904 is bonded to a front side of an intermediate IC die 906, as shown in FIG. 9. The bonding can be hybrid bonding, such as bonding backside bond pads 974 on the first intermediate wafer to front side bond pads 956 on the second intermediate wafer, and bonding the exterior surface of the backside dielectric layer(s) 934 on the first intermediate wafer to the exterior surface of the front side dielectric layer(s) 926 on the second intermediate wafer.

At block 1012, the semiconductor substrate of the second intermediate wafer is thinned from a backside of the second intermediate wafer, like described with respect to block 1006. As show in FIG. 9, the semiconductor substrate 916 of the intermediate IC die 906 is thinned from the backside.

At block 1014, backside processing for intermediate IC dies on the second intermediate wafer is performed, like described with respect to block 1008. As illustrated by FIG. 9, the backside processing can include forming backside TSVs 966 through the semiconductor substrate 916 of the second intermediate wafer and connecting to metallization in the front side dielectric layer(s) 926 on the second intermediate wafer. The backside processing can further include forming backside dielectric layer(s) 936 with metallizations and backside bond pads 976 on the backside of the semiconductor substrate 916. The metallizations in the backside dielectric layer(s) 936 can be connected to the metallizations in the front side dielectric layer(s) 926 through the backside TSVs 966.

At block 1016, the second intermediate wafer is bonded to a distal wafer, such as backside to front side bonding as shown in FIG. 9. As a result of the bonding, a backside of an intermediate IC die 906 is bonded to a front side of a distal IC die 908, as shown in FIG. 9. The bonding can be hybrid bonding, such as bonding backside bond pads 976 on the second intermediate wafer to front side bond pads 958 on the distal wafer, and bonding the exterior surface of the backside dielectric layer(s) 936 on the second intermediate wafer to the exterior surface of the front side dielectric layer(s) 928 on the distal wafer.

At block 1018, the semiconductor substrate of the base wafer is thinned from a backside of the base wafer, like described with respect to block 1006. As show in FIG. 9, the semiconductor substrate 912 of the base IC die 902 is thinned from the backside.

At block 1020, backside processing for base IC dies on the base wafer is performed, like described with respect to block 1008. As illustrated by FIG. 9, the backside processing can include forming backside TSVs 962 through the semiconductor substrate 912 of the base wafer and connecting to metallization in the front side dielectric layer(s) 922 on the base wafer. The backside processing can further include forming backside dielectric layer(s) 932 with metallizations and exterior connector backside pads 972 on the backside of the semiconductor substrate 912. The metallizations in the backside dielectric layer(s) 932 can be connected to the metallizations in the front side dielectric layer(s) 922 through the backside TSVs 962. The backside processing for the base IC dies 902 can further include forming the passivation layer 980 and external connectors 982. At block 1022, the bonded wafers are singulated by dicing (e.g., by sawing) along the scribe lines of the wafers to separate individual multi-die devices that have been formed. Each of the multi-die devices can be as shown in FIG. 9.

The various operations of blocks of the method 1000 can be repeated and/or omitted to form various multi-die devices. The method 1000 has been provided as an example of how some multi-die devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-die devices. A person having ordinary skill in the art will readily understand how to form other multi-die devices based on the description of the method 1000 above.

While the foregoing is directed to specific examples, other and further examples may be devised without departing from the basic scope thereof, and the scope thereof is determined by the claims that follow.

What is claimed is:

1. A method for testing a wafer, the method comprising:
  applying power to a first pad in a test site region on the wafer, the test site region being in a first scribe line on the wafer, the test site region being electrically connected to a first device under test region on the wafer, the first device under test region being in a second scribe line on the wafer and comprising a first device under test, a third scribe line being disposed on the wafer between the test site region and the first device under test region, the third scribe line extending longitudinally in a direction that intersects with a direction that the first scribe line extends longitudinally, the first device under test region electrically connected to a second device under test region in a fourth scribe line on the wafer; and
  detecting a first signal from a second pad in the test site region on the wafer, the first signal being at least in part a response of the first device under test to the power applied to the first pad.

2. The method of claim 1, wherein the test site region is electrically connected to the first device under test region by stitch metal lines extending across the third scribe line.

3. The method of claim 1, wherein the first scribe line and the second scribe line are a same scribe line.

4. The method of claim 1, wherein:
  the second device under test region comprises a second device under test;
  a fifth scribe line is disposed on the wafer between the first device under test region and the second device under test region;
  the first device under test region is disposed between the third scribe line and the fifth scribe line; and
  the fifth scribe line extends longitudinally in a direction parallel to the direction that the third scribe line extends longitudinally.

5. The method of claim 4, wherein the first signal is at least in part a combined response of the first device under test and the second device under test to the power applied to the first pad.

6. The method of claim 4, wherein the first device under test and the second device under test are serially connected.

7. The method of claim 4 further comprising detecting a second signal from the second pad, the first signal being at least in part a response of the second device under test to the power applied to the first pad, the first signal not being based on the second device under test, the second signal not being based on the first device under test.

8. The method of claim 4 further comprising applying an enable signal to a third pad in the test site region on the wafer, wherein:
  the first device under test region includes a first control circuit, and the second device under test region includes a second control circuit;
  the first control circuit and the second control circuit are communicatively coupled to the third pad;
  the first control circuit is configured to selectively electrically connect the first device under test between the first pad and the second pad in response to the enable signal; and
  the second control circuit is configured to selectively electrically connect the second device under test between the first pad and the second pad in response to the enable signal.

9. The method of claim 8, wherein the first control circuit and the second control circuit are serially connected.

10. The method of claim 9, wherein each of the first control circuit and the second control circuit includes one flip-flop or serially connected flip-flops configured to propagate the enable signal.

11. The method of claim 10 further comprising applying a clock signal to a fourth pad in the test site region on the wafer, each of the one flip-flop or serially connected flip-flops of each of the first control circuit and the second control circuit having a clock input node electrically connected to the fourth pad.

12. A wafer comprising:
  integrated circuit (IC) dies having a scribe line disposed between neighboring IC dies of the IC dies;
  a test site region in a first scribe line, the test site region comprising a first pad and a second pad, the first scribe line extending longitudinally in a first direction;
  a first device under test region in a second scribe line, the first device under test region comprising a first device under test, a third scribe line being disposed between the test site region and the first device under test region, the third scribe line extending longitudinally in a second direction that intersects with the first direction, the test site region and the first device under test region being configured to provide a first signal at the second pad that is at least in part a response of the first device under test to power applied to the first pad; and
a second device under test region in a fourth scribe line, the second device under test region comprising a second device under test connected to the first device under test.

13. The wafer of claim 12, wherein the test site region is electrically connected to the first device under test region by stitch metal lines extending across the third scribe line.

14. The wafer of claim 12 further comprising:
a fifth scribe line being disposed between the first device under test region and the second device under test region, the fifth scribe line extending longitudinally in a third direction parallel to the second direction, the second device under test region being disposed between the third scribe line and the fifth scribe line, the first device under test and the second device under test being connected serially between the first pad and the second pad.

15. The wafer of claim 12 further comprising:
a fifth scribe line being disposed between the first device under test region and the second device under test region, the fifth scribe line extending longitudinally in a third direction parallel to the second direction, the second device under test region being disposed between the third scribe line and the fifth scribe line, wherein:
the test site region comprises a third pad;
the first device under test region includes a first control circuit, and the second device under test region includes a second control circuit;
the first control circuit is communicatively coupled to the third pad;
the first control circuit and the second control circuit are configured to propagate a signal applied to the third pad;
the first control circuit is configured to selectively electrically connect the first device under test between the first pad and the second pad in response to the signal applied to the third pad; and
the second control circuit is configured to selectively electrically connect the second device under test between the first pad and the second pad in response to the signal applied to the third pad.

16. A method for forming a stacked die device, the method comprising:
testing a first wafer comprising:
applying power to a first pad in a test site region on the first wafer, the first wafer comprising integrated circuit dies separated by scribe lines, the test site region being disposed in a first scribe line of the scribe lines; and
detecting a first signal from a second pad in the test site region, the first signal being based on a response of a first device under test in a first device under test region to the power applied to the first pad, the first device under test region being electrically connected to the test site region across a second scribe line of the scribe lines that intersects the first scribe line; and
bonding the first wafer to a second wafer.

17. The method of claim 16, wherein the first signal is based on a combined response of the first device under test in the first device under test region and a second device under test in a second device under test region to the power applied to the first pad, the first device under test and the second device under test being serially connected between the first pad and the second pad, a third scribe line of the scribe lines being disposed between the first device under test region and the second device under test region.

18. The method of claim 16, wherein detecting the first signal from the second pad is at a first time period, and wherein testing the first wafer further comprises:
selectively electrically connecting the first device under test between the first pad and the second pad during the first time period;
selectively electrically connecting a second device under test between the first pad and the second pad during a second time period different from the first time period, the second device under test being in a second device under test region, a third scribe line of the scribe lines being disposed between the first device under test region and the second device under test region; and
detecting a second signal from the second pad at the second time period, the second signal being based on a response of the second device under test to the power applied to the first pad.

19. The method of claim 16, wherein the first device under test region is electrically connected to the test site region by stitch metal lines extending across the second scribe line.

20. The method of claim 16 further comprising singulating the integrated circuit dies of the bonded first and second wafers, the singulating comprising dicing along the scribe lines.

* * * * *